(12) United States Patent
Clevenger et al.

(10) Patent No.: US 8,829,986 B1
(45) Date of Patent: Sep. 9, 2014

(54) STRUCTURE AND METHOD FOR INTEGRATED SYNAPTIC ELEMENT

(71) Applicant: International Business Machines Corporation, Armonk, NY (US)

(72) Inventors: Lawrence A Clevenger, LaGrangeville, NY (US); Chandrasekhar Narayan, San Jose, CA (US); Gregory A Northrop, Putnam Valley, NY (US); Carl J Radens, LaGrangeville, NY (US); Brian C Sapp, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/899,887

(22) Filed: May 22, 2013

(51) Int. Cl.
*H01L 25/00* (2006.01)
*H01L 23/522* (2006.01)

(52) U.S. Cl.
CPC .................................. *H01L 23/5228* (2013.01)
USPC ......................................................... 327/565

(58) Field of Classification Search
USPC .................................. 327/308, 525, 564, 565
See application file for complete search history.

(56) References Cited

U.S. PATENT DOCUMENTS

| | | | |
|---|---|---|---|
| 5,614,764 A | 3/1997 | Baerg et al. | |
| 7,662,674 B2 | 2/2010 | Maiz et al. | |
| 7,777,337 B2 * | 8/2010 | Harada | 257/758 |
| 7,998,330 B2 | 8/2011 | Fang et al. | |
| 8,013,421 B2 | 9/2011 | Ono | |
| 8,084,762 B2 | 12/2011 | Tran | |
| 8,319,348 B2 * | 11/2012 | Lee et al. | 257/774 |
| 2011/0240941 A1 | 10/2011 | Pickett et al. | |

* cited by examiner

*Primary Examiner* — Jeffrey Zweizig
(74) *Attorney, Agent, or Firm* — IP Authority, LLC; Ramraj Soundararajan

(57) ABSTRACT

Disclosed is a synaptic element that uses electro-migration in an interconnect structure, wherein the interconnect structure is optimized to give control of resistivity change following current flow. The synaptic element exhibits resistivity that is a function of the amount (of charge) and direction of current flow, wherein a continuously variable resistance is obtained by controlling the volume of a designed void in the interconnect structure.

24 Claims, 5 Drawing Sheets

Time and Energy to change the resistance of synaptic element by 10%

| Interconnect Material | Line width (nm) | Line height (nm) | Cross-section area (nm2) | Current density (mA/μm2) | Current (mA) | Voltage | Time (Hours) | Time (Seconds) | Energy (mJ) | Energy (μJ) |
|---|---|---|---|---|---|---|---|---|---|---|
| Industry Standard Plated Copper | 200 | 400 | 80000 | 1 | 0.08 | 1 | 50 | 180000 | 14400 | 14400000 |
| Pure Copper | 200 | 400 | 80000 | 1 | 0.08 | 1 | 0.5 | 1800 | 144 | 144000 |
| Pure Aluminum | 200 | 400 | 80000 | 1 | 0.08 | 1 | 0.005 | 18 | 1.44 | 1440 |
| Pure Aluminum | 27 | 60 | 1620 | 1 | 0.00162 | 1 | 0.005 | 18 | 0.02916 | 29.16 |

Electromigration Suseptibility Relative to Industry Standard Plated Copper

Plated Copper 1
Pure Copper 100
Pure Aluminum 10000

FIG. 6

STRUCTURE AND METHOD FOR INTEGRATED SYNAPTIC ELEMENT

BACKGROUND OF THE INVENTION

1. Field of Invention

The present invention relates generally to the field of interconnect structures. More specifically, the present invention is related to a novel interconnect structure having voids whose size may vary according to electro-migration, and a method for use with the same.

2. Discussion of Related Art

Non Von-Neumann computational architectures show considerable promise for offering significantly faster ways to solve some classes of problems. Synaptic elements offer one of many ways to create a non Von-Neumann architecture. Any material that exhibits at least two resistance states can in principle offer a path to mimic a synaptic element between any two neurons. However, materials exhibiting only bi-stable states offer only limited architecture possibilities. Ideally a material that is capable of multiple or continuously varying stable resistance states will provide the greatest flexibility for design and be closer to allowing mimicking the brain's learning or adapting function. Many materials that have been researched as storage or memory elements can serve as a synaptic element but often require complex integration schemes.

Some examples include phase change memory (PCM) materials, resistive random access memory (RRAM) materials and spin torque transfer (STT) magnetic tunnel junctions, to name a few. All of them have some drawbacks, which can be managed with additional complexity. For example, in phase change materials, it is easy to decrease the resistance by incrementally crystallizing the glassy material, but is it is not possible to slowly increase the resistance (without melting, quenching and/or heating) to reach the desired higher resistance. This adds a lot of circuit complexity and iterations to hit the desired higher resistance state. RRAM materials typically only exhibit two stable states making for limited usefulness. STT junctions offer variable resistance but they tend to relax to their ground state which raises issues of stable states. Further, in STT junctions the electrical resistance contrast between the two stable states is very limited.

SUMMARY OF THE INVENTION

A synaptic element that can exhibit stable and yet continuously variable resistance states is disclosed herein. Embodiments of the present invention are an improvement over the prior art systems and methods.

The present invention discloses a method for use with an interconnect structure, in which nominally homogeneous conducting material in a conducting portion of the structure migrates back and forth between prefabricated voids and reservoirs that are located along the conducting portion. The method comprises applying a first current having a pre-determined magnitude in a first direction through the conducting portion to intentionally increase its resistance to a first level, as the conducting material around at least one of the voids migrates to at least one of the reservoirs; and applying a second current having the same pre-determined magnitude in a second direction, that is opposite of the first direction, through the conducting portion to intentionally decrease its resistance from the first level to a second level, as the conducting material migrates from at least one of the reservoirs to at least one of the voids.

In one embodiment, the present invention discloses an interconnect structure comprising: a metal line having a variable resistance disposed between a first circuit with a second circuit, the metal line connecting the first circuit with the second circuit and including: at least one flared-up portion acting as a metal reservoir and at least one void that is variable in size disposed within the metal line, wherein (i) the metal line has a resistance value that is a function of the size of the void, (ii) a first current having a pre-determined magnitude applied to the metal line in a first direction increases the size of the void due to electro-migration of metal atoms from the metal reservoir to a region near the void, thereby increasing the resistance of the metal line to a first resistance value, and (iii) a second current having the same pre-determined magnitude applied to the metal line in a second direction that is opposite of the first direction decreases the size of the void due to electro-migration of metal atoms near the void to the metal reservoir, thereby decreasing the resistance of the metal line to a second resistance value.

In one embodiment, the present invention discloses an interconnect structure comprising: a metal line disposed between a first circuit with a second circuit, the metal line connecting the first circuit with the second circuit; at least one metal reservoir, the metal line connected to the metal reservoir; at least one void that is variable in size disposed within the metal line, and wherein (i) the metal line has a resistance value that is a function of the size of the void, (ii) a first current having a pre-determined magnitude applied to the metal line in a first direction increases the size of the void due to electro-migration of metal atoms from the metal reservoir to a region near the void, thereby increasing the resistance of the metal line to a first resistance value, and (iii) a second current having the same pre-determined magnitude applied to the metal line in a second direction that is opposite of the first direction decreases the size of the void due to electro-migration of metal atoms near the void to the metal reservoir, thereby decreasing the resistance of the metal line to a second resistance value.

The first current may be a set of short current pulses, wherein the set of short current pulses incrementally increases the resistance of the metal line to the first value.

The second current may be a set of short current pulses, wherein the set of short current pulses incrementally decreases the resistance of the metal line to the second value.

The first current may be a long current pulse, wherein the long current pulse abruptly increases the resistance of the metal line to the first value.

The second current may be a long current pulse, wherein the long current pulse abruptly decreases the resistance of the metal line to the second value.

The ratio of the first resistance value to the second resistance value is preferably less than 10.

The metal line is preferably made from any of the following or alloys thereof: aluminum, copper, tin, indium, gallium, silver, and lead.

BRIEF DESCRIPTION OF THE DRAWINGS

FIG. 6 depicts a table showing typical line dimensions and line heights and the time and energy required to change the resistance by 10%.

DESCRIPTION OF THE PREFERRED EMBODIMENTS

Figure 1A:
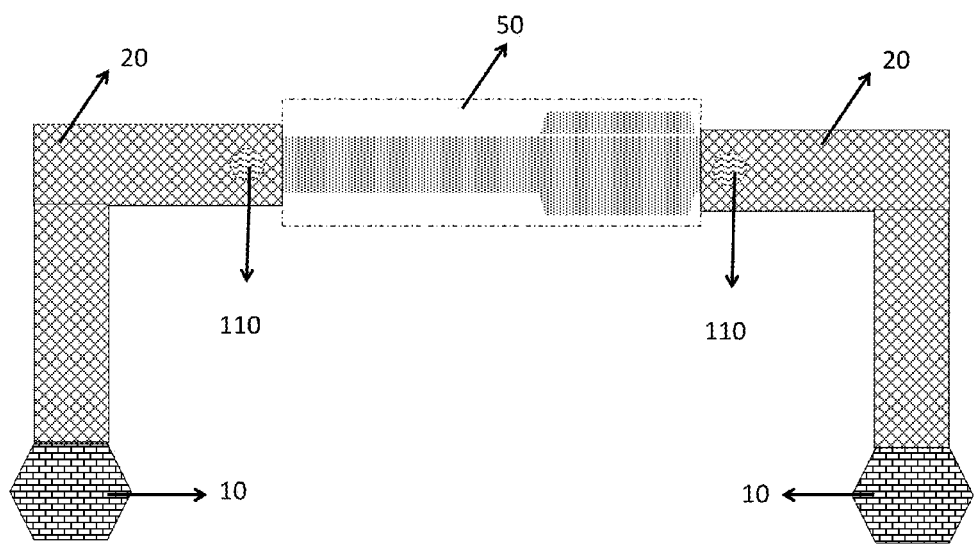
FIG. 1A illustrates a preferred embodiment where two neurons have a wiring disposed in between that connects them.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

For fabricating a system that can mimic the brain function, it is critical to demonstrate a material that has the basic function of the synapse that regulates the flow of information form one neuron to another. The synaptic connection between any two neurons is characterized by its ability to adjust its electrical resistance in response to the firing order and timing of the pre- and post-synaptic neurons. A pre-synaptic neuron firing just before a post-synaptic neuron is reason for the connection resistance to be lowered. The opposite firing sequence (i.e., a post-synaptic neuron firing just before the pre-synaptic neuron) results in the raising of the resistance of the synapse. The connection resistance also depends on the time elapsed between the firing events of the pre- and post-synaptic neurons. To build physical hardware to mimic the brain, it is necessary to develop technologies that allow for variable resistances at such synaptic connections that can be easily adjusted. The present invention discloses such an interconnect technology that allows for resistance modulation.

Particularly, the present invention discloses a synaptic element that uses electro-migration or stress-migration in a microelectronic chip interconnect structure, wherein the interconnect structure is optimized to give control of resistivity change following current flow. The synaptic element exhibits resistivity that is a function of the amount (of charge) and direction of current flow, wherein a continuously variable resistance is obtained by controlling the volume of a designed void in the interconnect structure. Leveraging electro-migration and stress migration phenomena, changes to a void volume (in the interconnect structure) can be engineered. In sharp (and non-intuitive) contrast to the semiconductor technology where an interconnect is specifically designed to minimize the effect of electro-migration and void formation, the present invention teaches an interconnect structure with voids that are designed to facilitate electro-migration.

Further, the present invention also teaches the use of materials specifically avoided by the semiconductor industry. As an example, prior to the semiconductor industry migrating from aluminum wiring to copper wiring, several industry-wide research programs studied the alloying of aluminum with copper and other additions to specifically slow down the electro-migration process. This disclosure teaches the use of metals that are especially susceptible to electro-migration.

FIG. 1A illustrates a preferred embodiment where two devices representing neurons marked as 10 (which may be two electric devices or circuits) have a wiring 20 that connects them. Interposed within wiring 20 is a portion of interconnect 50 that is the core of the present invention where a variable resistance may be programmed. In this embodiment, wiring 20 is made of materials that are typically used in semiconductor chip technology (but does not have to be limited to such materials) and have the characteristics of resistance to electromigration failure. Examples include aluminum-copper alloys or plated copper wires. The description above is for planar structures where all the devices (neurons) are on a single level and all of the interconnect wiring is also on the same level. For significantly higher interconnectivity, it is possible to have these electrical devices 10 disposed across many levels in which vias 110 can be used to achieve the connectivity from one layer to another. The presence or absence of vias 110 in the interconnect structure should not limit the scope of the invention. Similarly, the location of vias 110 in the interconnect structure should not limit the scope of the invention.

Figure 1B:
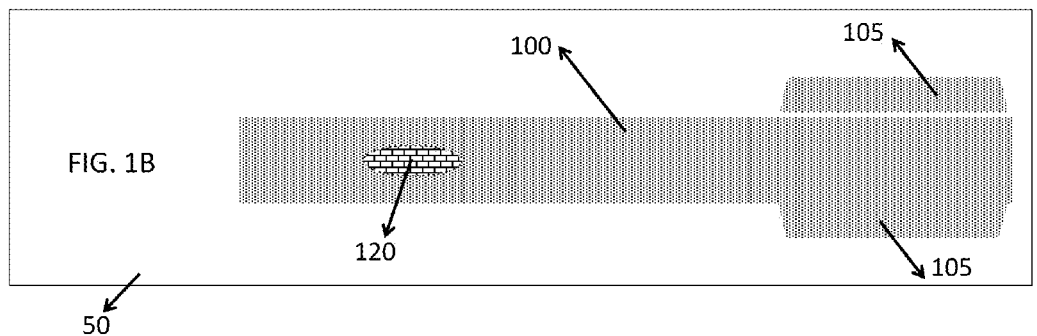
FIG. 1B illustrates a preferred embodiment showing a metal line that forms the electrical connection between two neurons.

FIG. 1B illustrates in detail the interconnect structure 50 depicted in FIG. 1A and represents the portion of the interconnect circuit where the resistance is programmable. In FIG. 1B, a metal line 100 has flared portions 105 which serve as a reservoir of metal for the electro-migration requirement to be described. Both 100 and 105 are made of materials that are prone to significant electromigration on passage of current of sufficient magnitude. Electromigration assisted electrical resistance change allows for the learning function in the circuit. Examples of materials that would fall under this category would be pure aluminum or metals or alloys with substantially low melting points. Other examples include, but are not limited to, tin, indium, gallium, silver, lead and alloys of these metals. An interconnect structure made with materials with a higher melting point that offer higher resistance to electromigration will allow for more gradual learning. Examples would include structures wherein this interconnect wire is made of alloyed copper or alloyed aluminum.

Also shown in FIG. 1B is a defect (by design) or void 120 in metal line 100, which is a region of missing metal. The size of this intentionally designed defect 120 will determine the starting resistance of metal line 100. If the size of the void 120 decreases during use, the resistance of the metal line 100 decreases. Conversely, if the size of the void 120 increases with use, the resistance of the metal line 100 increases.

The Table depicted in FIG. 6 shows calculated line dimensions and line heights, and the time and energy required to change the resistance by 10%. An estimate of susceptibility to electromigration is shown in the table. A current density of 1 mA/µm2 is assumed, as this is standard for electromigration testing in the semiconductor industry.

Industry standard copper wiring requires 50 hours of electrical stressing for the resistance to change by 10% but if the wiring is built at a smaller scale and uses pure aluminum then that same resistance shift can be achieved in 18 seconds. This demonstrates the importance of line dimensions and the material of choice.

If the pre-synaptic neuron fires before the post-synaptic neuron, it represents an event that should strengthen the connection, i.e., the resistance of the metal line 100 should decrease. On the other hand, if the sequence of firing is reversed, then the desired outcome should be an increase in the resistance of the metal line 100. The extent of the resistance increase, or decrease, should be a function of the time delay between the firing events (i.e., longer time delays require higher resistance changes). Such a connection resistance change will represent a method to build either a learning function or a deliberate programming function.

As an example, let us draw on what is believed to happen in the brain. When neuron A fires a pulse, it is due to the cumulative input it receives from many other neurons sending pulses to neuron A so that it exceeds a threshold. If we look at a specific neuron B to neuron A connection, there is a synapse between them that has a resistance to transmission of the pulse. If the pulse from neuron B arrives just in time to contribute to neuron A firing, then the synaptic connection between them is strengthened, i.e., the resistance of the synapse decreases to facilitate easier transmission of the pulse. On the other hand, if the input from neuron B is either late or too early, then the synapse becomes less relevant and the resistance is increased. In the present invention, the element 50 in FIG. 1A performs the function of tailoring the resistance. If it is desired that the resistance needs to increase, then a current is driven through element 50 to grow the void and thus raise the resistance. If, on the other hand, opposite effect is desired, current is driven through that element in the opposite direction to reduce the void size and thus lower the resistance.

Reprogramming Circuits and Adaptive Circuits:

The notion of using electro-migration to change line resistance is useful for two kinds of changeable circuits: (i) one that is more brain-like in that it is continually learning from observed patterns; and (ii) another which is a more abrupt interconnect resistance change is required to alter a circuit function. The present invention's teachings may be used in either case. While the first instance requires a more gradual resistance change with multiple events, the latter requires a more significant resistance change with one event.

Figure 2:
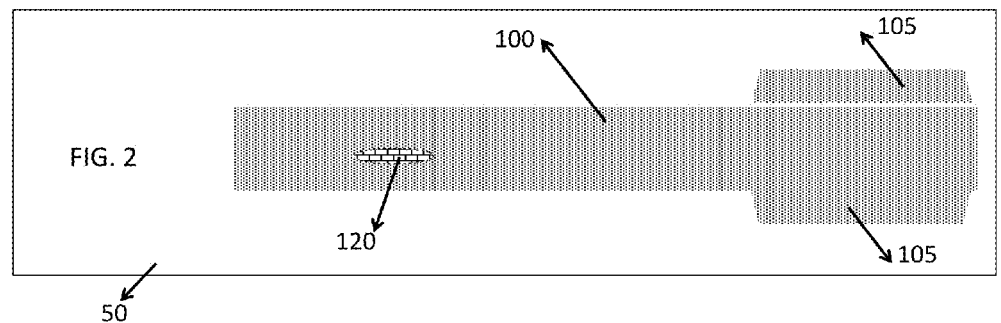
FIG. 2 illustrates void shrinkage and decreased wire resistance according the teachings of the present invention.

Decreasing the Resistance of the Connection:

As noted above, the resistance of the metal line 100 can be decreased by shrinking the size of the void 120. This is accomplished by driving current pulses through the metal line 100 from left to right in FIG. 2, which results in electrons flowing from right to left. At appropriately high current densities the electrons will move metal atoms in the direction of the electron flow. In the structure shown in FIG. 2, metal atoms will move from the flange areas 105 into the void, thereby shrinking the void 120. As a consequence of such shrinkage the resistance of the wire will decrease. It should be noted that a short set of pulses can provide a small incremental change in resistance, while a long pulse can provide a more drastic change in resistance.

Figure 3:
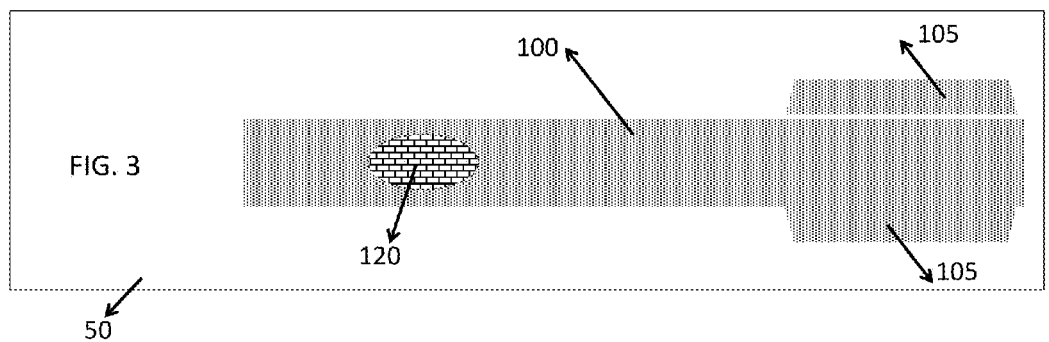
FIG. 3 illustrates void expansion and increased wire resistance according the teachings of the present invention.

Increasing the Resistance of the Connection:

Also, as noted above, the resistance of metal line 100 can be increased by growing the size of the void, as shown in FIG. 3. This is accomplished by driving an electrical current through the wire from right to left, which results in electrons flowing from left to right. At appropriately high enough current densities, this will move metal atoms from left to right, whereby void 120 increases in size. As a consequence of such an increase in the size of the void 120, the resistance of the wire will increase. Again, a short set of pulses can provide a small change in resistance, while a long pulse can provide a more drastic change in resistance.

Based on data in the Table shown in FIG. 6, a short pulse is of the order of 5 seconds, while a long pulse would be of the order of 15 seconds. If the current density is higher, then the time would be lower. In general, it is fair to say that a short pulse is long enough to effect a 2-3% change in resistance and a long pulse would effect a 10% change in resistance.

Figure 4:
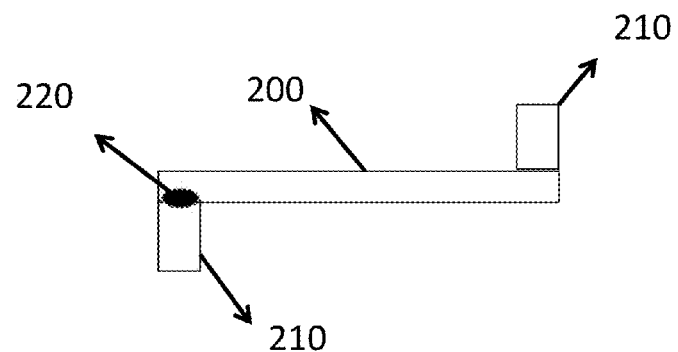
FIG. 4 shows a typical 3 level wiring layer in a semiconductor chip.

FIG. 4 shows a typical 3 level wiring layer in a semiconductor chip where 200 represent a line on given level and 210 depicts via structures to connect that line to levels above and below this line 200. This represents a typical structure that is tested for electromigration properties.

Figure 5:
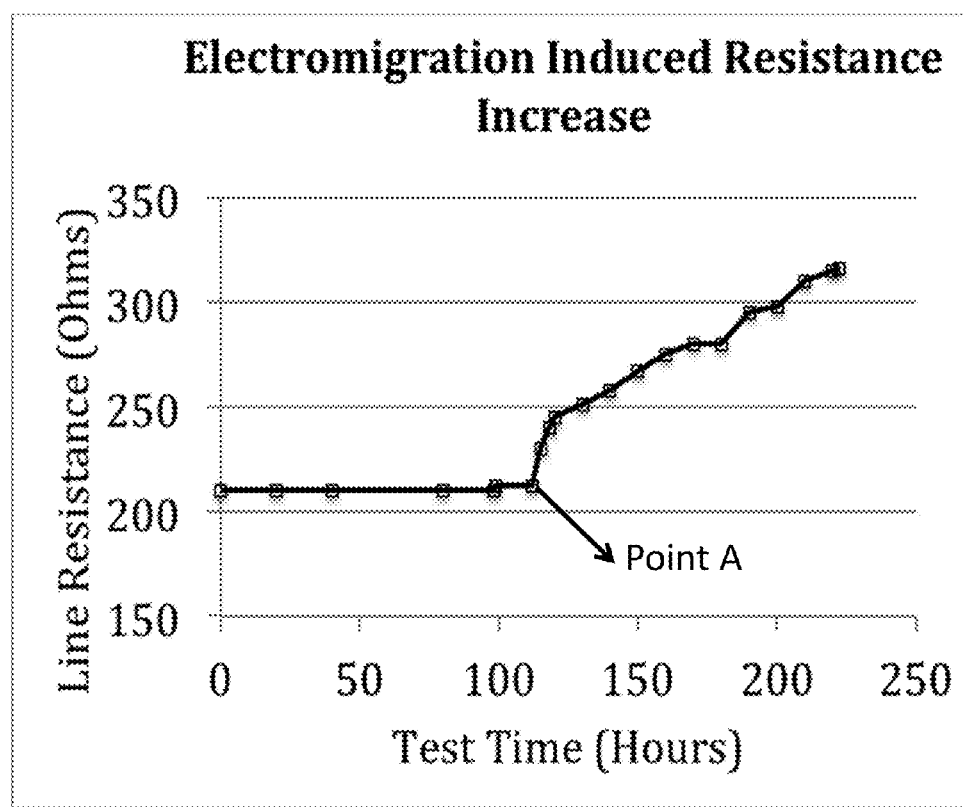
FIG. 5 depicts a graph associated with the electromigration testing of semiconductor interconnect wiring, wherein the graph shows how the resistance of the line changes with time as a current is passed through the circuit.

FIG. 5 depicts a graph associated with the electromigration testing of semiconductor interconnect wiring, wherein the graph shows how the resistance of the line changes with time as a current is passed through the circuit. These data were taken with industry standard plated copper lines alloyed with proprietary additives to offer electromigration resistance. During the early phase of electrical testing, there is no visible effect of stressing until approximately the 120 hour mark when the resistance starts to increase suddenly. This is represented by Point A in FIG. 5. This is associated with the formation of a void. The appearance of such a void is shown in FIG. 4 as 220. Thereafter, the resistance increases as the electrical stressing continues. When the resistance of the line increases by 50%, the test is terminated.

The present invention discloses a method for use with an interconnect structure, in which nominally homogeneous conducting material in a conducting portion of the structure migrates back and forth between prefabricated voids and reservoirs that are located along the conducting portion. The method comprises applying a first current having a pre-determined magnitude in a first direction through the conducting portion to intentionally increase its resistance to a first level, as the conducting material around at least one of the voids migrates to at least one of the reservoirs; and applying a second current having the same pre-determined magnitude in a second direction, that is opposite of the first direction, through the conducting portion to intentionally decrease its resistance from the first level to a second level, as the conducting material migrates from at least one of the reservoirs to at least one of the voids.

In one embodiment, the present invention discloses an interconnect structure comprising: a metal line having a variable resistance disposed between a first circuit with a second circuit, the metal line connecting the first circuit with the second circuit and including: at least one flared-up portion acting as a metal reservoir and at least one void that is variable in size disposed within the metal line, wherein (i) the metal line has a resistance value that is a function of the size of the void, (ii) a first current having a pre-determined magnitude applied to the metal line in a first direction increases the size of the void due to electro-migration of metal atoms from the metal reservoir to a region near the void, thereby increasing the resistance of the metal line to a first resistance value, and (iii) a second current having the same pre-determined magnitude applied to the metal line in a second direction that is opposite of the first direction decreases the size of the void due to electro-migration of metal atoms near the void to the metal reservoir, thereby decreasing the resistance of the metal line to a second resistance value.

In one embodiment, the present invention discloses an interconnect structure comprising: a metal line disposed between a first circuit with a second circuit, the metal line connecting the first circuit with the second circuit; at least one metal reservoir, the metal line connected to the metal reservoir; at least one void that is variable in size disposed within the metal line, and wherein (i) the metal line has a resistance value that is a function of the size of the void, (ii) a first current having a pre-determined magnitude applied to the metal line in a first direction increases the size of the void due to electro-migration of metal atoms from the metal reservoir to a region near the void, thereby increasing the resistance of the metal line to a first resistance value; and (iii) a second current having the same pre-determined magnitude applied to the metal line in a second direction that is opposite of the first direction, decreases the size of the void due to electro-migration of metal atoms near the void to the metal reservoir, thereby decreasing the resistance of the metal line to a second resistance value.

The first current may be a set of short current pulses, wherein the set of short current pulses incrementally increases the resistance of the metal line to the first value.

The second current may be a set of short current pulses, wherein the set of short current pulses incrementally decreases the resistance of the metal line to the second value.

The first current may be a long current pulse, wherein the long current pulse abruptly increases the resistance of the metal line to the first value.

The second current may be a long current pulse, wherein the long current pulse abruptly decreases the resistance of the metal line to the second value.

In one embodiment, the ratio of the first resistance value to the second resistance value is preferably less than 10.

In one embodiment, the metal line is preferably made from any of the following or alloys thereof: aluminum, copper, tin, indium, gallium, silver, and lead.

CONCLUSION

A system and method have been shown in the above embodiments for the effective implementation of an interconnect structure having voids whose size may vary according to electro-migration, and a method for use with the same. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. An interconnect structure comprising:
 a metal line having a variable resistance portion disposed between a first circuit and a second circuit, said metal line connecting said first circuit with said second circuit and including:
  at least one flared-up portion acting as a metal reservoir; and
  at least one void that is variable in size disposed within said metal line,
 wherein:
 said metal line has a resistance that is a function of the size of said void,
 a first current having a pre-determined magnitude applied to said metal line in a first direction increases the size of said void due to electro-migration of metal atoms from said metal reservoir to a region near said void, thereby increasing the resistance of said metal line to a first resistance value, and
 a second current having said pre-determined magnitude applied to said metal line in a second direction that is opposite of said first direction decreases the size of said void due to electro-migration of metal atoms near said void to said metal reservoir, thereby decreasing the resistance of said metal line to a second resistance value.

2. The interconnect structure of claim 1, wherein when said first current is a set of short current pulses, said set of short current pulses incrementally increases the resistance of the metal line to said first value.

3. The interconnect structure of claim 1, wherein when said second current is a set of short current pulses, said set of short current pulses incrementally decreases the resistance of the metal line to said second value.

4. The interconnect structure of claim 1, wherein when said first current is a long current pulse, said long current pulse abruptly increases the resistance of the metal line to said first value.

5. The interconnect structure of claim 1, wherein when said second current is a long current pulse, said long current pulse abruptly decreases the resistance of the metal line to said second value.

6. The interconnect structure of claim 1, wherein the ratio of the first resistance value to the second resistance value is less than 10.

7. The interconnect structure of claim 1, wherein said interconnect structure comprises one or more vias disposed in said metal line.

8. The interconnect structure of claim 1, wherein said interconnect structure is planar.

9. The interconnect structure of claim 1, wherein said metal line is made from any of the following or alloys thereof: aluminum, copper, tin, indium, gallium, silver, and lead.

10. An interconnect structure comprising:
 a metal line disposed between a first circuit and a second circuit, said metal line connecting said first circuit with said second circuit;
 at least one metal reservoir, said metal line connected to said metal reservoir;
 at least one void that is variable in size disposed within said metal line, and
 wherein:
 said metal line has a resistance that is a function of the size of said void,
 a first current having a pre-determined magnitude applied to said metal line in a first direction increases the size of said void due to electro-migration of metal atoms from said metal reservoir to a region near said void, thereby increasing the resistance of said metal line to a first resistance value, and
 a second current having said pre-determined magnitude applied to said metal line in a second direction that is opposite of said first direction decreases the size of said void due to electro-migration of metal atoms near said void to said metal reservoir, thereby decreasing the resistance of said metal line to a second resistance value.

11. The interconnect structure of claim 10, wherein when said first current is a set of short current pulses, said set of short current pulses incrementally increases the resistance of the metal line to said first value.

12. The interconnect structure of claim 10, wherein when said second current is a set of short current pulses, said set of short current pulses incrementally decreases the resistance value of the metal line to said second value.

13. The interconnect structure of claim 10, wherein when said first current is a long current pulse, said long current pulse abruptly increases the resistance of the metal line to said first value.

14. The interconnect structure of claim 10, wherein when said second current is a long current pulse, said long current pulse abruptly decreases the resistance of the metal line to said second value.

15. The interconnect structure of claim 10, wherein the ratio of the first resistance value to the second resistance value is less than 10.

16. The interconnect structure of claim 10, wherein said interconnect structure comprises one or more vias disposed in said metal line.

17. The interconnect structure of claim 10, wherein said interconnect structure is planar.

18. The interconnect structure of claim 10, wherein said metal reservoir is made from any of the following or alloys thereof: aluminum, copper, tin, indium, gallium, silver, and lead.

19. A method for use with an interconnect structure, in which nominally homogeneous conducting material in a conducting portion of the structure migrates back and forth between prefabricated voids and reservoirs that are located along the conducting portion, the method comprising:
   applying a first current having a pre-determined magnitude in a first direction through the conducting portion to intentionally increase its resistance to a first level, as the conducting material around at least one of the voids migrates to at least one of the reservoirs; and
   applying a second current having said pre-determined magnitude in a second direction that is opposite of said first direction through the conducting portion to intentionally decrease its resistance from the first level to a second level, as the conducting material migrates from at least one of the reservoirs to at least one of the voids.

20. The method of claim 19, wherein the first and second levels of resistance are selected so that a change is produced in the weights of interconnection between two functional elements that are in electrical connection with the conducting portion.

21. The method of claim 19, wherein the ratio of the first level's resistance to the second level's resistance is less than 10.

22. The method of claim 19, wherein the resistance of the conducting portion is reversibly changed 50 times between the first level and the second level.

23. The method of claim 19, wherein the interconnect structure is planar.

24. The method of claim 19, wherein said conducting portion is made from any of the following or alloys thereof: aluminum, copper, tin, indium, gallium, silver, and lead.

\* \* \* \* \*